US009394622B2

(12) United States Patent
Wiener et al.

(10) Patent No.: US 9,394,622 B2
(45) Date of Patent: Jul. 19, 2016

(54) DEVICE AND METHOD FOR THE TREATMENT OF FLAT MATERIAL TO BE TREATED

(71) Applicant: Atotech Deutschland GmbH, Berlin (DE)

(72) Inventors: Ferdinand Wiener, Burgthann (DE); Christian Thomas, Erlangen (DE); Olaf Lorenz, Altdorf (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 14/427,226

(22) PCT Filed: Nov. 12, 2013

(86) PCT No.: PCT/EP2013/073617
§ 371 (c)(1),
(2) Date: Mar. 10, 2015

(87) PCT Pub. No.: WO2014/076078
PCT Pub. Date: May 22, 2014

(65) Prior Publication Data
US 2015/0252488 A1 Sep. 10, 2015

(30) Foreign Application Priority Data

Nov. 16, 2012 (DE) .......................... 10 2012 221 012

(51) Int. Cl.
*B08B 1/02* (2006.01)
*C25D 7/06* (2006.01)
(Continued)

(52) U.S. Cl.
CPC .............. *C25D 7/0621* (2013.01); *B08B 3/041* (2013.01); *B08B 3/08* (2013.01); *C23C 18/1619* (2013.01);
(Continued)

(58) Field of Classification Search
None
See application file for complete search history.

(56) References Cited

U.S. PATENT DOCUMENTS

| 4,385,967 A | 5/1983 | Brady et al. |
| 4,459,183 A | 7/1984 | Brady et al. |

(Continued)

FOREIGN PATENT DOCUMENTS

| DE | 3236545 A1 | 5/1983 |
| DE | 3624481 A1 | 1/1988 |

(Continued)

OTHER PUBLICATIONS

Japanese Patent Office; Office Action, Appln. No. 2015-542243, Nov. 4, 2015.

(Continued)

*Primary Examiner* — Michael Barr
*Assistant Examiner* — Ryan Coleman
(74) *Attorney, Agent, or Firm* — Paul & Paul

(57) ABSTRACT

The device 1 according to the invention is suggested for gentle treatment of a flat material B to be treated with a treatment liquid F. The device 1 has the following components: at least one treatment chamber 20, in which the treatment liquid F can be accumulated up to a bath level M, at least one supply device 7 for the supply of the treatment liquid F into the at least one treatment chamber 20, at least one transport device 30, with which the material B to be treated can be transported in the horizontal position in a transport plane E below the bath level M through the at least one treatment chamber 20, at least one reception area 4 for the treatment liquid F, and at least one discharge device 40 with, respectively, at least one discharge opening 41 for the treatment liquid F for conveying it from the at least one treatment chamber 20 with a respective discharge rate into the at least one reception area 4. The at least one discharge device 40 respectively has at least one regulating system 43, with which the discharge rate of the treatment liquid F is adjustable through the at least one discharge opening 41.

15 Claims, 8 Drawing Sheets

Figure 1:
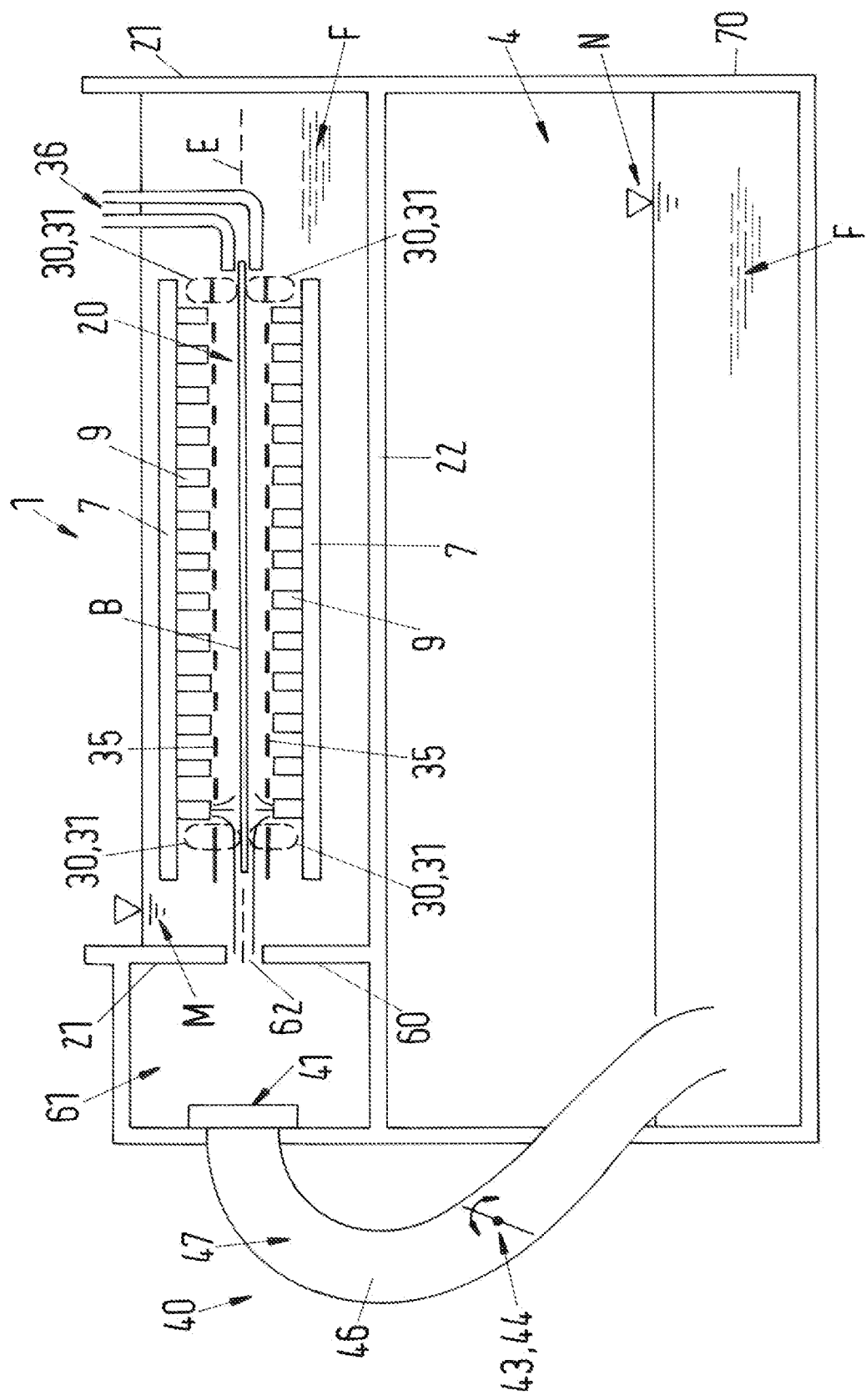

(51) Int. Cl.
  *C23C 18/16*  (2006.01)
  *C25D 5/08*  (2006.01)
  *C25D 21/10*  (2006.01)
  *C25D 21/12*  (2006.01)
  *C25D 17/00*  (2006.01)
  *C25D 17/02*  (2006.01)
  *B08B 3/04*  (2006.01)
  *B08B 3/08*  (2006.01)
  *C25D 17/08*  (2006.01)
  *H05K 3/24*  (2006.01)

(52) U.S. Cl.
  CPC ......... *C23C 18/1628* (2013.01); *C23C 18/1669* (2013.01); *C23C 18/1675* (2013.01); *C25D 5/08* (2013.01); *C25D 17/00* (2013.01); *C25D 17/02* (2013.01); *C25D 17/08* (2013.01); *C25D 21/10* (2013.01); *C25D 21/12* (2013.01); *H05K 3/241* (2013.01)

(56) References Cited

U.S. PATENT DOCUMENTS

| | | | |
|---|---|---|---|
| 4,554,062 A | 11/1985 | Sergio | |
| 4,776,939 A | 10/1988 | Bläsing et al. | |
| 4,832,811 A | 5/1989 | Hosten | |
| 4,986,888 A | 1/1991 | Hosten et al. | |
| 5,803,984 A * | 9/1998 | Lordo et al. | 134/18 |
| 6,068,755 A | 5/2000 | Matsuda | |
| 7,862,661 B2 | 1/2011 | Kappler | |
| 2012/0231574 A1 | 9/2012 | Wang | |

FOREIGN PATENT DOCUMENTS

| | | | |
|---|---|---|---|
| DE | 3823072 | A1 | 1/1990 |
| DE | 19633796 | A1 | 2/1998 |
| DE | 19934298 | A1 | 7/2000 |
| JP | H01252799 | A | 10/1989 |
| JP | H0456799 | A | 2/1992 |
| JP | H05 331687 | A | 12/1993 |
| JP | 2010 037600 | A | 2/2010 |
| WO | 9807904 | A1 | 2/1998 |
| WO | 0038218 | A2 | 6/2000 |

OTHER PUBLICATIONS

Sybille Picard, European Patent Office, International Search Report, PCT/EP2013/073617, Oct. 10, 2014.

* cited by examiner

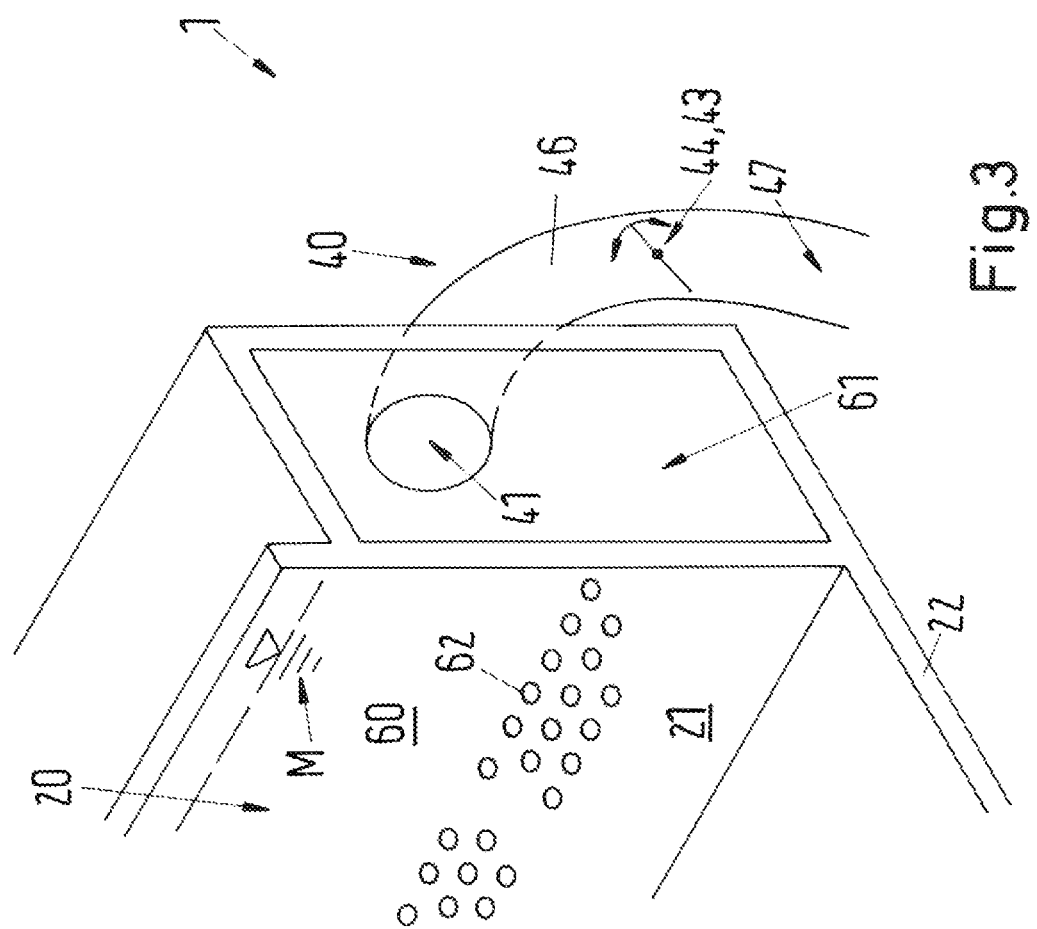

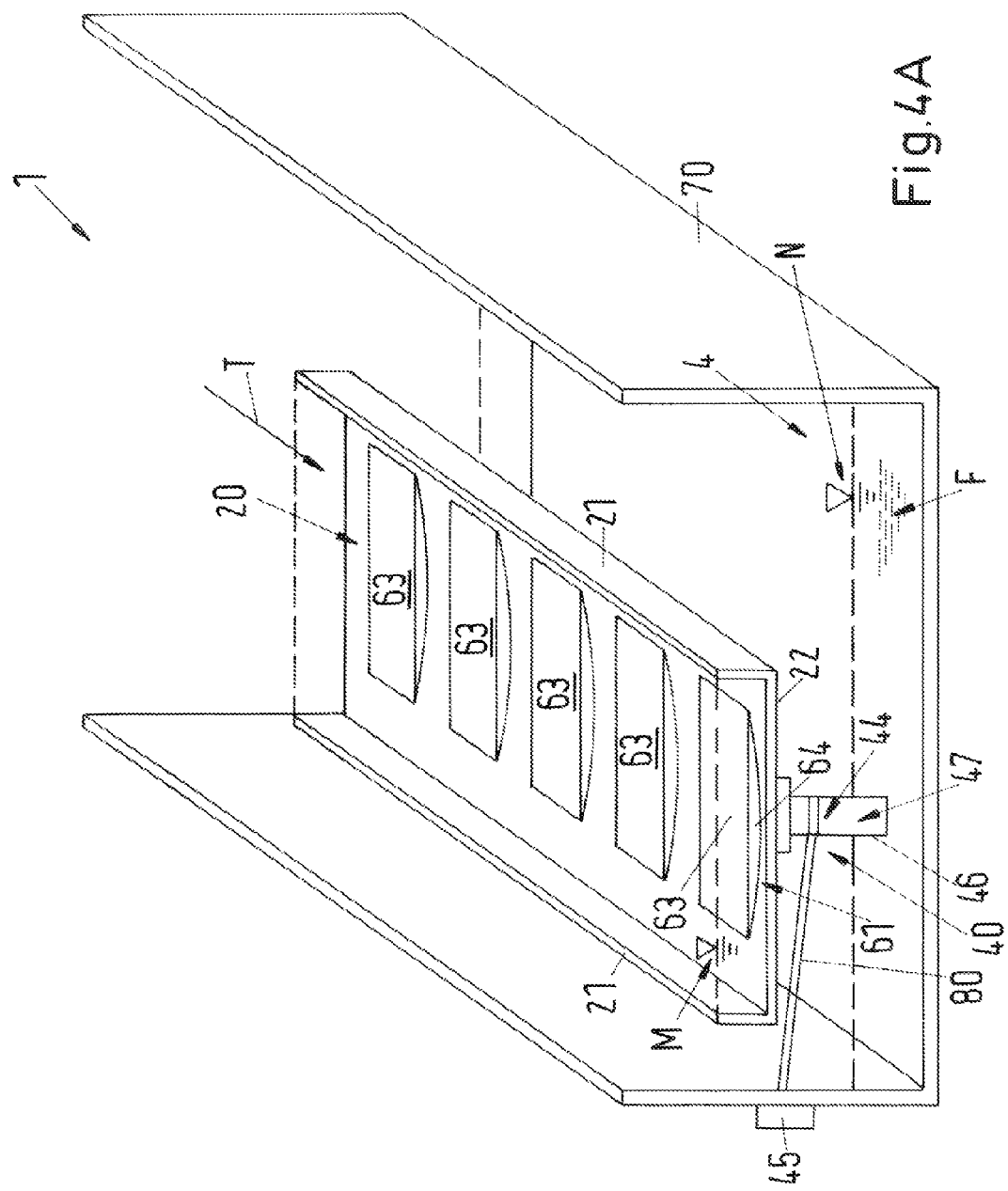

DEVICE AND METHOD FOR THE TREATMENT OF FLAT MATERIAL TO BE TREATED

CROSS-REFERENCE TO RELATED APLLICATIONS

This is a national stage 371 application of International Application No. PCT/EP2013/073617, filed Nov. 12, 2013.

The present invention concerns a device and a method for the chemical or electrolytic treatment of flat material to be treated, in particular of plate material with a low inherent stiffness, such as of conductor foils, with a treatment liquid.

For the treatment of flat material to be treated, for example for a wet chemical treatment, such as metallization or wet chemical cleaning, the material to be treated is transported by means of a transport device through a treatment device and brought in contact with a treatment liquid. The transport is in this context partially performed by several transport rollers or transport wheels, which are spaced apart from one another, respectively opposite to one another, the material to be treated being transported between them by means of the treatment device. In this process, the treatment liquid is supplied to the surface of the material to be treated. The material to be treated is, for example, kept in the horizontal position and continuously transported through the treatment device. Devices used for this purpose are described, for example, in DE 32 36 545 A1, DE 36 24 481 A1 and DE 196 33 796 A1.

For the treatment, it is often advantageous that the treatment liquid is moved during the treatment. Consequently, for example, for a wet chemical method, sufficient liquid exchange resp. material exchange is achieved on the surface to be treated, in particular also in small holes in the material to be treated. Likewise, contamination, which is present on the surface of the material to be treated, can be removed in an easier and more effective manner during cleaning processes. For the generation of the liquid's movement, nozzles are, for example, used, with which the surfaces can be streamed on with the treatment liquid. The nozzle openings can, for example, be arranged below the bath level (DE 32 36 545 A1).

The movement of the liquid, however, has, for the treatment of material to be treated with a low inherent stiffness, for example of foils, amongst others the disadvantage that the material to be treated can be deformed during its transport through the treatment device such that it becomes jammed in the transport equipment, for example in the area of the transport rollers or transport wheels. As a result, it may be damaged. In addition, the material flow through the treatment device is interrupted by such failures.

Thus, an object of the present invention is to find means with which a uniform, but nevertheless effective action of a treatment liquid onto the material to be treated is achieved without the previously mentioned failures occurring. The treatment device should be usable with best results for wet chemical processes as well as for cleaning processes. In particular, an object consists of ensuring the uniformity of the action of the treatment liquid onto the material to be treated in such a manner that the position of the material to be treated within the treatment device, in particular for the treatment and while transporting the material to be treated, is stabilized so that the material to be treated can be transported as possible without deformation and damage safely through the treatment device.

In so far as the term "flat material to be treated" is used in the description and in the claims, in particular materials are meant, which have a low inherent stiffness, such as metal foils or plastic foils for the most diverse fields of application, in particular conductor foils for the printed circuit board technology. Furthermore, they also designate flat material, which have a higher inherent stiffness, such as circuit boards, semiconductor wafers, glass plates, which are used for manufacturing of circuit carriers, such as circuit boards, photoelectric cells, such as photoelectric solar cells, and of screen panels. Film-like material can be available in form of a band or tape or in form of individual workpieces.

In the following, for the sake of better legibility, the term "at least one" will be mostly foregone in the description. However, a plurality of the device components mentioned is also regularly included, unless otherwise expressly specified.

The above-mentioned objects are solved by the device according to the invention and the method according to the invention for the chemical or electrolytic treatment of flat material to be treated.

According to a first aspect, the present invention concerns the device according to the invention. This device comprises at least the following components:
  at least one treatment chamber in which the treatment liquid can be accumulated up to a predetermined bath level;
  at least one supply device for the supply of treatment liquid into the at least one treatment chamber;
  at least one transport device, with which the material to be treated can be transported in the horizontal position in a transport plane below the bath level through the at least one treatment chamber;
  at least one reception area for receiving the treatment liquid; and
  at least one discharge device with, respectively, at least one discharge opening for the treatment liquid for conveying the treatment liquid from the at least one treatment chamber with a respective discharge rate into the at least one reception area as well as with at least one regulating system, respectively.

The respective discharge rate of the treatment liquid through the at least one discharge opening (also outflow opening) can be adjusted/regulated by means of the regulating system.

According to a second aspect, the present invention concerns the method for the chemical or electrolytic treatment of the flat material to be treated with the treatment liquid. The method can in particular be executed with the device according to the invention for the treatment of the flat material to be treated. The method comprises at least the following method steps:
  supplying the treatment liquid by means of the at least one supply device to the treatment chamber;
  discharging the treatment liquid with a respective discharge rate through respectively at least one discharge opening of the discharge device out of the treatment chamber into the at least one reception area;
  transporting the material to be treated by means of the at least one transport device in the horizontal position in the transport plane through the treatment chamber, wherein the material to be treated is transported below the bath level of the treatment liquid in the treatment chamber; and
  adjusting a respective discharge rate of the treatment liquid out of the treatment chamber by means of the regulating system.

The device according to the invention is particularly characterized in that the flat material to be treated is as little as possible deflected from its horizontal position during the treatment with the treatment liquid and during the transport through the treatment device. Through the formation of the device according to the invention and the process measures according to the invention, in particular also the corners and edges of the material to be treated are practically not deflected from the horizontal position by the treatment liquid supplied to the material to be treated and discharged from the treatment chamber. This leads to an unproblematic transport of the material to be treated through the treatment device. The material to be treated can be conducted in a precise position through the transport device without jamming or damage of the material to be treated.

The material to be treated is conveyed and conducted in a transport plane through the treatment chamber. The transport plane preferably extends in a horizontal plane. The transport direction is also horizontal. In principle, other orientations are of course also possible for the transport plane. The transport device is preferably formed by driven rollers or wheels fixed on shafts, which are located in the treatment chamber and which extend transversely with respect to the transport direction of the material to be treated. Two rollers or gear wheel shafts each are arranged one above the other so that the material to be treated is conducted through between them and driven forward by the pressure of the upper roller or the upper wheels through traction. A plurality of roller pairs or gear wheel shaft pairs are preferably arranged the one behind the other in the transport direction. Between two roller pairs or gear wheel shaft pairs, supply devices can be arranged, respectively.

The reception area, which is preferably arranged below the treatment chamber, is preferably formed in a storage container for the treatment liquid. The treatment liquid, which gets from the treatment chamber via the discharge device into the reception area, can also be conveyed back from the latter by means of the supply device into the treatment chamber. To supplement consumed treatment liquid, chemicals can be supplied to the storage container by means of suitable facilities.

The at least one supply device for the treatment liquid is preferably arranged opposite the surface(s) of the material to be treated, so that these surfaces are streamed against by the liquid during the supply of the treatment liquid into the treatment chamber. For this purpose, the at least one supply device is preferably formed as a streaming facility for the material to be treated. For the single-sided treatment of the material to be treated, at least one supply device is arranged on the side of the transport plane for the material, which is to be treated, i.e. either above or below the material to be treated running through. For a double-sided treatment, supply devices are arranged on both sides of the transport plane. The at least one supply device preferably has at least one nozzle (splash nozzle, spray nozzle or the like), respectively.

The supply device is preferably arranged on the material to be treated in such a manner that the supplied treatment liquid is streamed into the treatment chamber below the bath level of the treatment liquid. In addition, it is advantageous when the liquid is conveyed directly against the surface(s) of the material to be treated. Through the flow below the bath level, a uniform and metered supply of treatment liquid to the material to be treated is achieved and any unwanted additional entry of air resp. oxygen in the treatment liquid is avoided.

The discharge device includes the elements, which serve for the discharge of the treatment liquid from the treatment chamber into the reception area. Accordingly, the discharge device is formed at least by the discharge opening and the discharge duct. In a preferred embodiment of the present invention, the at least one discharge device, respectively, comprises at least one discharge line (in particular outflow line), which in particular contains the discharge duct (in particular outflow duct). The discharge line can for example be shaped as a tube, hose or the like. The discharge duct of the discharge line is connected directly or indirectly to the discharge opening and is formed to conduct the liquid to be discharged into the reception area. To this end, the discharge duct can directly discharge into the reception area.

According to the invention, the regulating element of the respectively at least one regulating system for setting the respective discharge rate is arranged on and/or in the at least one discharge line, in particular on and/or in the discharge duct, namely at any location of the discharge duct, or in the direction of flow before, in or behind the discharge opening.

The regulating system comprises a regulating element, a drive and a control device. The regulating element, for example a valve, a vane or a flap, acts on the treatment liquid to be discharged. The drive, for example a motor, acts with a force on the regulating element in order to adjust it. The control device, for example an electronic computer, defines how the regulating element is to be moved and regulates the drive for this purpose. Particularly preferably, each of the regulating systems has at least one of both following regulating elements: a pump and/or an element, which changes the cross-section of the discharge duct. These regulating elements can be provided for individually or in combination with one another. The regulating system serves to set the discharge rate of the treatment liquid, that is the volume of the treatment liquid discharged from the treatment chamber per unit of time, to a predetermined value. By means of the regulating system, in particular the liquid flow through the discharge opening is to be regulated so that a constant bath level results in the treatment chamber. For regulating the bath level, at least one level sensor provided for in the treatment chamber can act on the regulating system.

Regulating elements are in particular vanes, flaps, valves and the like. These regulating elements change the cross-section of the discharge duct or the discharge opening in order to regulate the flow rate of the treatment liquid. These regulating elements are preferably arranged within the discharge duct, in particular on one of the ends of the discharge duct. For example, the regulating element can be arranged directly on or in the discharge opening. A pump can also be arranged as the regulating element for example in the discharge line. The discharge rate can be set by changing the cross-section of the discharge opening or of the discharge duct. By means of the regulating element, a great discharge rate is achieved when setting a large cross-section of the discharge opening or discharge duct, and a small discharge rate when setting a small cross-section.

In contrast to a regulating element changing the cross-section of the discharge line resp. of the discharge duct, a pump can control resp. regulate the discharge rate of the treatment liquid independently of the height level of the liquid in the treatment chamber and in the reception area, which acts on the treatment fluid to be discharged and which promotes its transfer from the treatment chamber into a reception area arranged below the treatment chamber by setting of a conveying rate for the treatment liquid.

In a further preferred embodiment of the present invention, the device according to the invention has at least two, for example two, three, four or even more discharge devices. In this case, the respective discharge rate from the treatment chamber into the at least one reception area via the at least two discharge devices is jointly adjustable, for example simultaneously, by means of a single regulating system. This can be achieved in such a way that to each of the discharge devices is assigned at least one of the above-mentioned regulating elements of the regulating system, wherein these elements are actuated jointly by means of a drive. Very particularly preferred are vanes, flaps and/or valves as the regulating elements, which can be actuated jointly via drives connected with one another or via vanes, flaps and/or valves connected with one another, which are actuated via one drive. Thus, for example, the cross-sections of neighbouring outflow ducts or discharge openings can be changed simultaneously in order to control resp. regulate the discharge rate.

In a further preferred embodiment of the present invention, the at least one regulating system respectively has a drive, for example a motor, which is arranged spatially separated from the at least one regulating element, in particular from the at least one element changing the cross-section of the discharge duct. For example, the element changing the cross-section of the discharge duct can be arranged in the treatment chamber or in a discharge chamber or in the reception area, while the drive is located outside this room, in particular in a room, which contains no liquid or vapors. This has the advantage that, on the one hand, a correspondingly set up drive can be used for several elements changing the cross-section of the discharge duct, so that also the common setting of the cross-sections of the discharge ducts is simplified. In addition, the design of the treatment device is also simplified, since lower costs are caused for the sealing, the assembly and the integration as well as the maintenance of the drive.

In a further preferred embodiment of the present invention, the at least one discharge device/discharge duct ends up in the at least one reception area below a liquid level formed by the treatment liquid, which is available there. For example, the discharge line of the discharge device immerses into the treatment fluid located in the reception area. This avoids an undesirable air resp. oxygen entry into the treatment liquid by liquid falling down. This entry would cause constituents of the treatment liquid to disadvantageously change, for example to be decomposed. The reception area serves on the one hand for collecting the treatment liquid discharged via the discharge device and, on the other hand, also for collecting treatment liquid, which flows out through overflow holes formed in side walls delimiting the treatment chamber or via these side walls downwards. The overflow holes are arranged above the bath level of the treatment liquid in the treatment chamber.

The treatment chamber is preferably formed by at least one bottom wall and essentially parallel to one another arranged side walls standing opposite to one another, said side walls being arranged vertically on the bottom wall and, thus, close the treatment chamber in a leak-proof manner towards the bottom wall.

In a further preferred embodiment of the present invention, at least one screen device is arranged between the treatment chamber and the at least one discharge opening. Furthermore, a discharge chamber, respectively, is preferably formed between the at least one screen device and the at least one discharge opening. In a particular embodiment, in the case that a screen device of a treatment chamber and a plurality of discharge openings of accordingly several discharge devices are provided for, a single discharge chamber can be provided for, which is arranged between the screen device and the plurality of discharge openings. Passage openings are formed in the screen device or the screen device leaves a passage between it and an adjacent wall of the treatment chamber. The treatment liquid gets from the treatment chamber via the passage openings into the discharge chamber and from there through the discharge opening(s) into the discharge duct(s) of the discharge device(s). The treatment liquid therefore gets from the treatment chamber through at least one passage opening in the screen device or through a passage opening arranged between the screen device and the walls delimiting the treatment chamber into the discharge chamber.

In an advantageous design of the present invention, the at least one passage opening is arranged below the bath level in the treatment chamber. This prevents that air passes through these openings and thus gets into the discharge opening and the discharge duct.

By means of the screen device and of the discharge chamber, in particular the flow of the treatment liquid is influenced in the treatment chamber. These components of the device according to the invention allow a largely uniform outflow of the treatment liquid from the treatment chamber. This also decreases or prevents the tendency of the material to be treated to be deflected from its planar position. Thus, these components allow to prevent an irregular flow within the outflowing treatment liquid, so that the guiding of the material to be treated in a constantly planar position in the treatment chamber can be ensured. In particular, a temporally variable and thus irregular suction effect on the material to be treated can be avoided.

In a first design variant of the present invention, the screen device may preferably be arranged vertically. It has at least one passage opening for the passage of the treatment liquid through the screen device and for entry into the discharge chamber. The passage opening(s) is/are preferably approximately arranged on the height level of the transport plane and in particular preferably sidewards and adjacent to the conveying path, in which the material to be treated is conducted, i.e. below the bath level of the treatment liquid in the treatment chamber. Due to this arrangement of the passage opening(s), a cross flow of the treatment liquid from the passing material to be treated towards the passage openings is achieved. This cross flow runs practically parallel to the transport plane (=plane for the material to be treated). This furthermore prevents that the flow of the treatment liquid in the treatment chamber has flow components that are perpendicular to the transport plane. Or, at least, the proportion of such flow components is reduced. This also prevents a deflection of the material to be treated from the transport plane. The screen device can, for example, be realized by a hole wall, which has a plurality of passage openings. The hole wall can be formed by one of the side walls defining the treatment chamber.

Preferably, a plurality of passage openings are available, which are distributed in a large surface area for example grid-shaped over the screen device. This surface area preferably extends essentially over the whole distance that the material to be treated covers through the treatment chamber. Thereby the liquid flow in the treatment chamber is distributed via a large room area, so that the flow velocity in this room area is low, thereby depressing an undesirable deflection of the material to be treated.

In the treatment chamber, additional liquid guide elements can furthermore be provided for, which serve to keep the flow of the treatment liquid in the vicinity of the transport plane for the material to be treated. For this purpose, these elements are preferably arranged in this room area, namely preferably between the conveying path, in which the material to be treated is transported, and the passage openings in the screen device. The liquid guide elements can, for example, be V-shaped steel plates, which are arranged in the treatment chamber in such a manner that the liquid flowing away from the material to be treated is directly conducted towards the passage openings.

In a preferred embodiment of the first design variant explained above, at least two screen devices can be provided for, one of them, respectively, being arranged on one of both sides of the conveying path in the essentially opposing parallel side walls, which delimit the treatment chamber. Beyond the respective screen device, a discharge chamber each and at least one discharge opening each are in this case arranged next to the respective screen device.

In a second design variant, the at least one screen device respectively forms at least partially the bottom wall of the treatment chamber. For example, it can extend essentially parallel to a lower wall region of the discharge chamber. The discharge chamber is located in this design variant below the screen device. For example, the discharge chamber can be formed in the bottom area of a container in such a way that at least a portion of the near-bottom space in the container is separated from the remaining space located above it in the container by means of the screen device, thereby forming the discharge chamber, while the remaining space forms the treatment chamber above the screen device. Preferably, the screen device is arranged above the lower wall region of the discharge chamber and spaced apart from the latter in order to form the discharge chamber. The screen device extends in the horizontal direction. A circumferential passage opening for the treatment liquid, through which the treatment liquid can get out of the treatment chamber into the discharge chamber is located between the screen device and the lower wall region of the outflow chamber. Preferably, the screen device is located essentially below the conveying path in which the material to be treated is conveyed.

In a preferred embodiment of the second design variant explained above, the at least one screen device can be formed by a drain plate, respectively. The at least one drain plate is preferably formed with respectively at least one guide element facing towards the lower wall region of the respective discharge chamber, for example shaped as a folding edge. This forms the circumferential passage opening between the lower wall region and the guide element. The passage distance between the at least one guide element and the lower wall region of the discharge chamber is in this case reduced by the width of the guide element. The guide element reduces the cross-section of the passage opening.

In a further preferred embodiment of this second design variant, the passage distance can, at locations of the at least one guide element, which are adjacent to a discharge opening, be smaller than at other locations of the at least one guide element, which are further away from the discharge opening. The size of the cross-section of the circumferential passage opening is therefore dependent on the position relative to the discharge opening(s): the smaller the distance of this position to a discharge opening is, the smaller is the passage distance and vice versa. Through this embodiment, the discharge flow of the treatment liquid is uniform in such a way that the flow vectors that form in the treatment liquid flowing out have, at all locations at the transition from the treatment chamber to the discharge chamber, preferably the same or almost the same amount, regardless of whether a portion of the treatment liquid must travel a short path to the discharge opening or a long one. Due to the position-variable average distance, vertical flow components of the discharged treatment liquid are homogenized in various ways in the treatment chamber. This also prevents an irregular suction effect of the treatment liquid flowing out on the material to be treated. By means of a suitable design of the guide element, it is therefore possible in a simple way to reduce or prevent bending of the material to be treated, in particular at its ends and edges.

In the device according to the invention for the treatment of flat material to be treated, the described screen devices can be used individually or in combination, respectively, according to both design variants.

For electrochemical treatment, the device according to the invention further has the following components: at least one counter-electrode, at least one device for feeding the current to the material to be treated and at least one power supply. The counter-electrode is an anode, in the case of electrochemical metal deposition, and a cathode, in the case of electrochemical etching or anodizing process. Preferably, an anode is made of a material that is inert under the treatment conditions, for example made of a noble metal or a material coated with a noble metal or a mixed oxide, which behaves under these conditions as an inert material, for example made of titanium. The mixed oxide can be, for example, an iridium mixed oxide. The anode can be provided in the form of a expanded mesh material. Alternatively, the metal to be deposited, which is then in specific containers and dissolves during the treatment may also be used as the material. The device for feeding the current to the material can be provided in the form of clamps or other gripping elements, which accompany and/or conduct and/or convey the material to be treated during transport through the treatment chamber. When the material to be treated is gripped only on one side of the transport path, it can be advantageous to provide the at least one outflow device on the other resp. opposite side of the transport path. Alternatively, stationary wheels, rollers and the like are also possible. The power supply is built in a conventional manner and delivers DC current/voltage or pulsed current/voltage (unipolar, bipolar).

Furthermore, the device may have further aggregates, like an air injection system, a heater, filtration devices, pumps, sensors for physical and chemical parameters and the like, for example for the bath level and the liquid level and the temperature of the treatment liquid. Such sensors can be used to regulate the bath level in the treatment area.

Exemplary embodiments are now described with reference to the appended figures.

Figure 2:
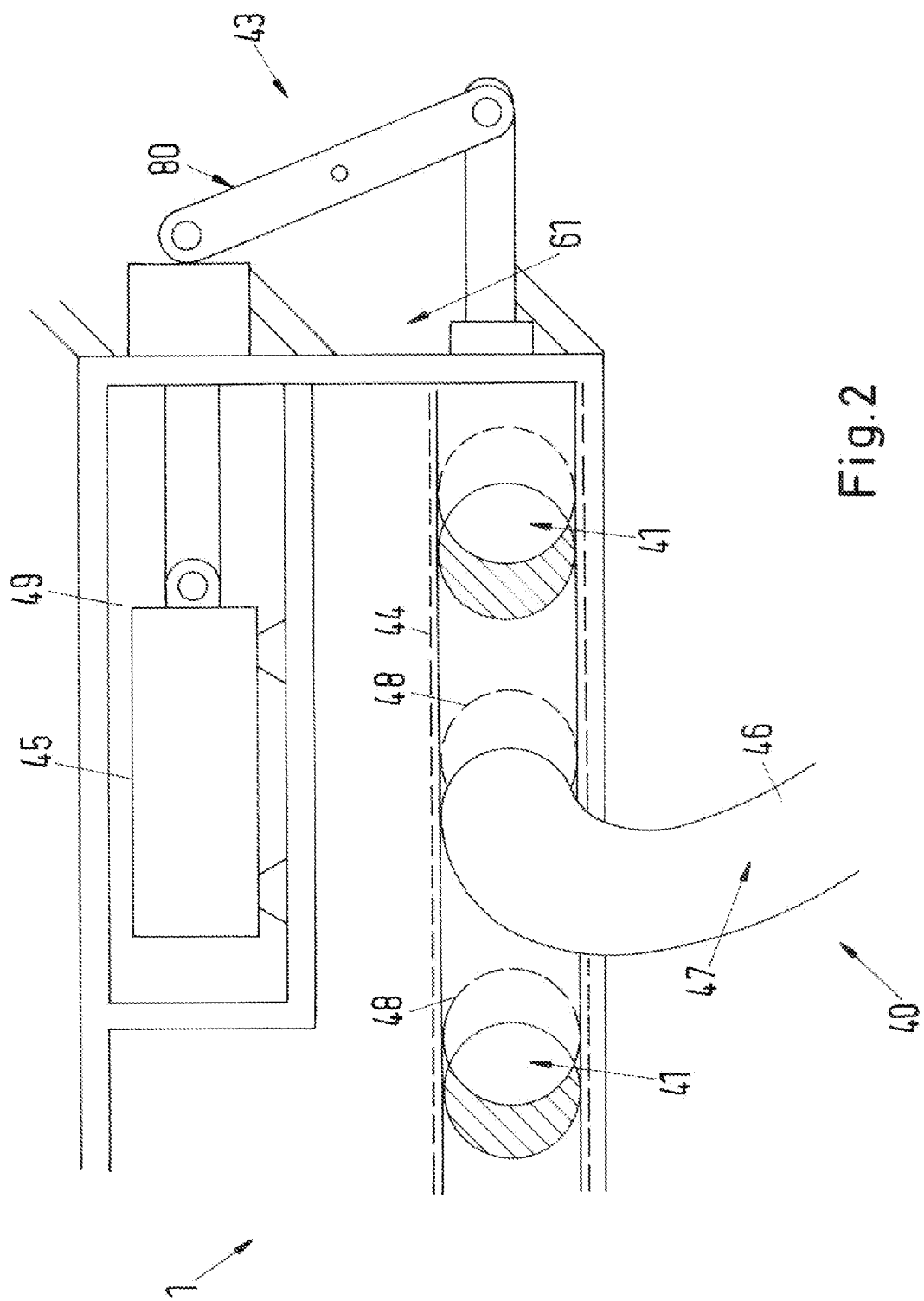
Figure 5A:
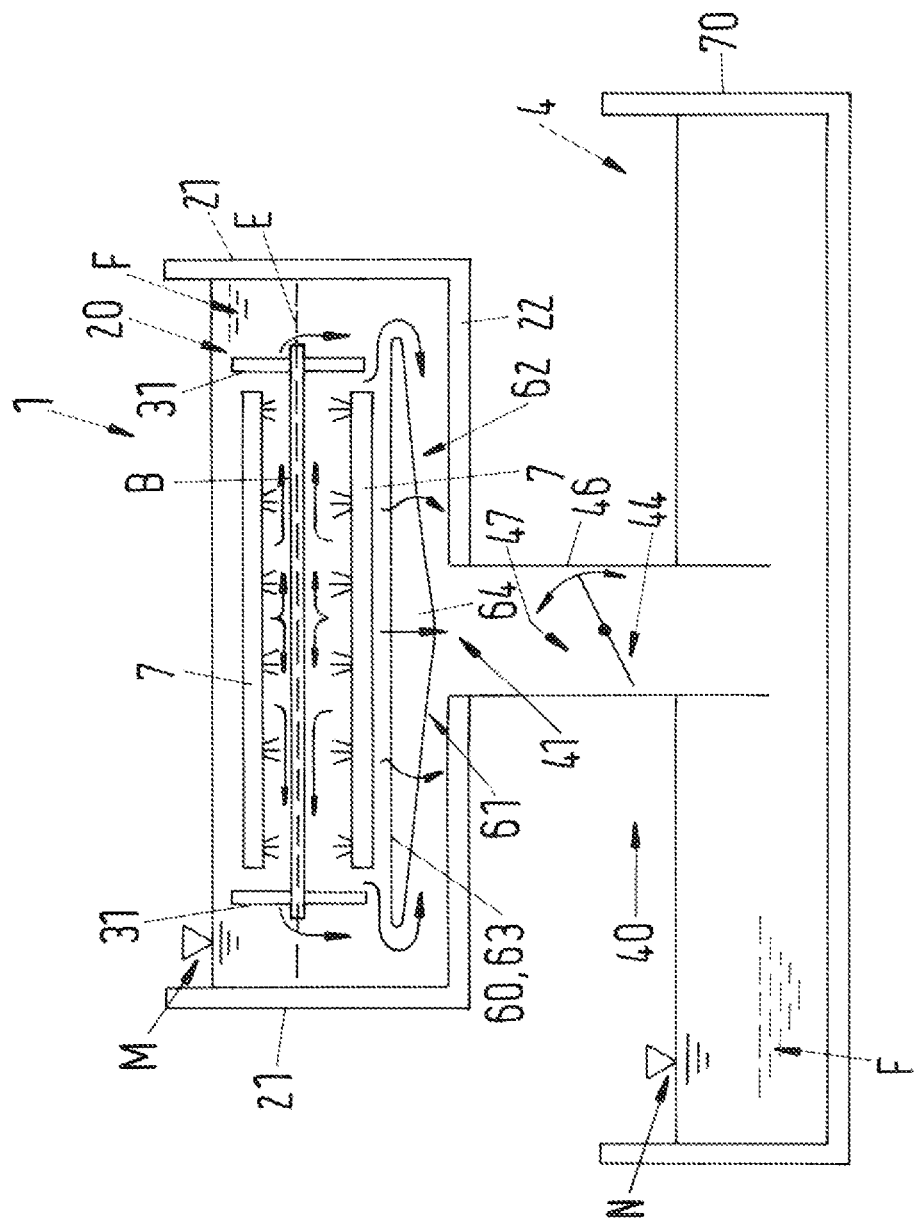
Figure 5B:
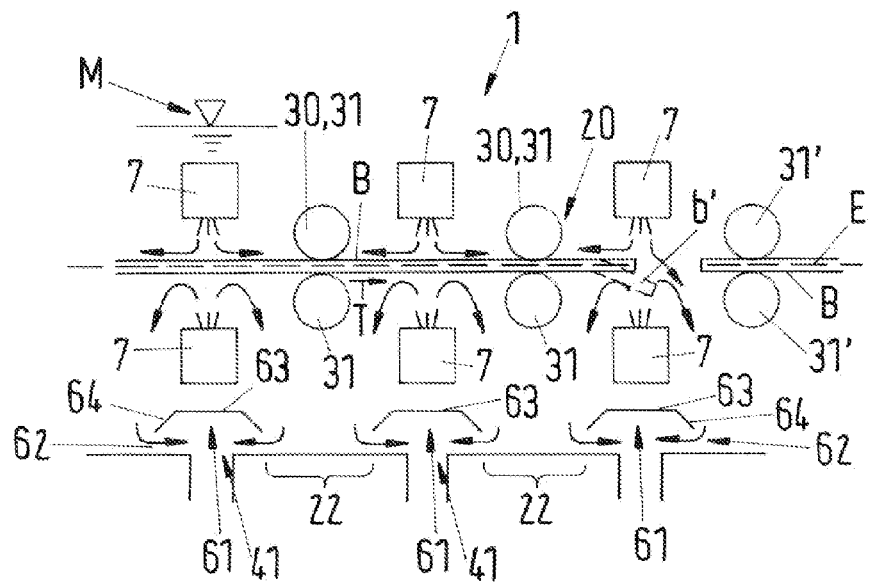
Figure 6:
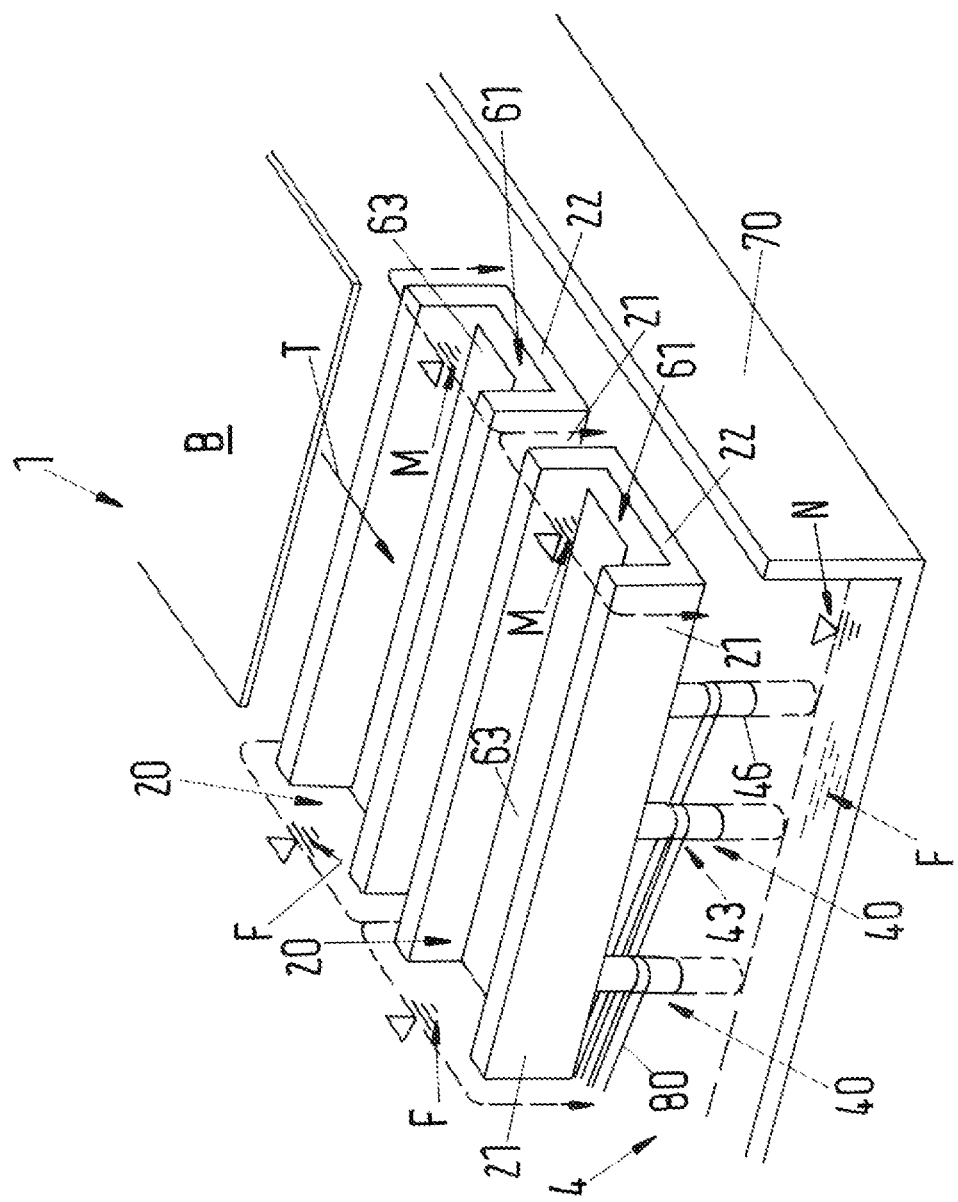

FIG. 1: shows a schematic representation of a device according to the invention for the treatment of material to be treated in a sectional view comprising a screen device in one side wall defining the treatment chamber (first design variant, first embodiment);

FIG. 2: shows a schematic representation of the device according to the invention in the first design variant sectionwise in a perspective view from the left side (second embodiment);

FIG. 3: shows a schematic representation of the device according to the invention in the first design variant sectionwise in a perspective view from the right side (third embodiment);

FIG. 4: shows schematic representations of a device according to the invention in a second design variant in a perspective view slantwise from the front; (A) in a first embodiment; (B) in a second embodiment;

FIG. 5: shows a schematic representation of the device according to the invention in the second design variant in a sectional view in a first embodiment; (A) image plane perpendicular to the transport direction; (B) image plane parallel to the transport direction; (C) detailed view of FIG. 5B;

FIG. 6: shows a schematic representation of the device according to the invention in the second design variant in a perspective view slantwise from the front, third embodiment.

In the figures, the same reference signs designate and refer to elements with the same function and/or to the same elements.

FIG. 1 represents the device 1 according to the invention for the treatment of a film-like material B to be treated in a first design variant. This device, a so-called plater, serves for wet chemical electrochemical treatment, wherein metal is electrochemically deposited onto the surface of the material to be treated. For delimitation of the treatment chamber 20, this device has side walls 21 arranged on the sides, which extend parallel to the transport direction of the material to be treated, as well as a bottom wall 22 that delimits the treatment chamber. Furthermore, the treatment chamber is closed transversely with respect to the transport direction by further side walls, which have slots for carrying through the material to be treated. To seal the treatment chamber against treatment liquid F flowing-out, pairs of squeeze rollers are arranged on these slots, the material to be treated being conducted through between them when being conveyed into resp. out of the treatment chamber (not shown).

FIG. 1 shows the material B to be treated located in the treatment chamber 20, for example a film, in cross-section in horizontal alignment, wherein the transport plane E extends in a transport direction in the treatment chamber 20 along the transport direction. The material to be treated is conveyed in the transport direction perpendicular to the image plane, for example away from the viewer. For this purpose, the material to be treated is conveyed by means of wheels 31 being mounted to shafts at a certain distance to one another (not shown), said shafts extending transversely with respect to the transport direction. These transport means, which are components of transport devices 30, can be driven and are shifted with respect to the image plane shown here. Wheels 31 acting at the edges of the material to be treated are indicated merely exemplarily. Between the wheels shown, further wheels are arranged, which touch the material to be treated forward over its whole width at locations spaced apart from one another and drive it forward through self-propulsion.

Furthermore, anodes 35 that are broken-worked are arranged above and below the material B to be treated. They are connected with a current supply (not shown). The material B to be treated is in electric contact via contacting clamps 36, one of which is shown gripping at the right edge of the material to be treated. Many such clamps are arranged in the transport direction one behind the other and are driven by a trum (not shown). The clamps are in turn connected with the power supply (not shown as well).

Viewed from the transport plane E beyond the anodes 35, supply devices 7 having nozzles 9 are located above and below the material B to be treated. The supply devices are formed by top and bottom pen stocks, which convey the treatment liquid F via the nozzles on both sides to the surfaces of the material to be treated. To allow the treatment liquid to get to the surfaces without hindrance, clearances are located in the anodes 35, through which the nozzle jets can pass unhindered.

The nozzles 9 and the remaining previously described components are arranged below the bath level M in the treatment chamber 20. For this purpose, the treatment liquid F is dammed up within the treatment chamber. The treatment chamber is delimited for this purpose sidewards by means of the side walls 21 and downwards by means of the bottom wall 22 as well as by the front walls not being shown. The supply of the treatment liquid into the treatment chamber causes that liquid flowing out is continuously supplied in order to meet a predetermined bath level.

The left side wall 21 forming the treatment chamber 20 represents a screen device 60, which has passage openings 62 in height of the transport plane E, sidewards next to the material B to be treated. In FIG. 1, only one such passage opening is represented. In this case, several passage openings are located in a row, the one behind the other, in the screen device 60. Several rows may also be present, see for this purpose FIG. 3, in which the screen device, viewed from the treatment chamber 20, is represented with a plurality of passage openings in several rows.

According to the embodiment of FIG. 3, the passage openings may also be arranged in groups. The screen device with the plurality of passage openings forms a hole wall. The bath level M in the treatment chamber during operation of the device is drawn above the passage openings 62 (FIG. 3).

The discharge chamber/outflow chamber 61 links behind the screen device 60 (FIG. 1). The outflow chamber furthermore links to a discharge opening/outflow opening 41 with a discharge line/outflow line 46, in which a discharge duct/outflow duct 47 is formed (FIGS. 1, 3). The outflow opening and the outflow line are components of a discharge device 40. In the outflow line is furthermore a regulating element 44 of a regulating system 43 arranged in the form of a flap, which is rotatable about a horizontal axis. The outflow line leads into the reception area 4 and ends below the liquid level N in the reception area.

The reception area 4 is formed by a storage container 70. In the latter, further aggregates, like pumps, heaters, fill level sensors and the like are furthermore arranged (not shown). The treatment liquid F getting into the reception area can be returned to the pen stocks 7 in the treatment chamber 20 by means of a pump and liquid lines provided for to this end. A liquid circuit is thereby realized (not shown).

During operation of the device 1, the treatment liquid F is supplied via the nozzles 9 of the pen stocks 7 to the material B to be treated. Thereby, the liquid dams up in the treatment chamber 20 and forms a bath level M above the pen stocks and the anodes 35 as well as above the transport plane E, in which the material to be treated is conducted. The treatment liquid flows off from the material to be treated transversely to the passage openings 62 in the screen device 60 and gets through them into the outflow chamber 61. From there, it comes through the outflow opening 41 and into the outflow duct 47 in the outflow line 46 and finally into the reception area 4 of the storage container 70. Due to the liquid guiding from the material to be treated through the passage openings into the outflow chamber, flowing liquid is uniformly distributed over a relatively large cross-section of the treatment chamber perpendicular to the transport plane and parallel to the transport direction. This is because the passage openings exert a flow resistance against the treatment liquid. In particular when, in a particularly preferred embodiment of the present invention, a plurality of passage openings are provided in the screen device, which are distributed raster-like and over a relatively large surface area of the screen device (see for example FIG. 3), the treatment liquid tends, when flowing out through the screen device, to flow uniformly through essentially the whole passage surface area provided by the passage openings. As a result, the flow velocity of the liquid to be discharged in the treatment chamber is relatively low, for the liquid flows through a very large portion of the treatment chamber and not only a narrowly limited area. As a result, the material to be treated is not subjected to any significant cross flows, which could lead to a deflection of the material to be treated upwards or downwards. Conducting the material to be treated between sequential transport means 31 is therefore easily possible.

The discharge rate of the treatment liquid F from the outflow chamber 61 and thus also out of the treatment chamber 20 is adjusted by means of the rotatable flap 44. The discharge rate and thus the flow velocity in the treatment chamber can be adjusted through the position of the flap. In addition, for a given supply rate of the treatment liquid into the treatment chamber, the bath level M in the treatment chamber is adjusted via the pen stocks 7.

FIG. 2 shows a detailed view of the device 1 according to the invention of the first design variant in a second embodiment. This embodiment is different from the one shown in FIG. 1 by the regulating system 43 used to regulate the discharge rate, the regulating elements 44 of which are arranged in this case in the area of the outflow opening 41 and not within the outflow lines 46 (downstream of the outflow openings). FIG. 2 shows the back wall of the outflow chamber 61, in which the outflow openings are located and on which a regulating element is arranged. The regulating element of the regulating system is formed in this case by a vane, which can close or release the outflow openings. Depending on the position of the vane, the outflow openings can be fully closed, partially closed (as is shown here) or fully released. The vane regulates the discharge rates through all outflow openings of the discharge devices 40 jointly, in such a way that it jointly adjusts their free cross-sections (a centrally located discharge device is shown only, whereas two other discharge devices being located adjacent to the centrally located device are not shown). For this purpose, the vane has in turn openings 48, which are arranged at the same distance as the outflow openings from one another. In addition, the openings in the vane have approximately the same cross-section as the outflow openings. A drive 45 is provided for to actuate the vane. The drive is located above the outflow chamber in a separate dry room 49. The drive moves the vane via a lever rod assembly 80 leftwards or rightwards and closes the outflow openings or releases them partially or fully. The drive is located in its own dry room 49 outside the outflow chamber 61. This allows easier sealing of the dry room.

Figure 4B:
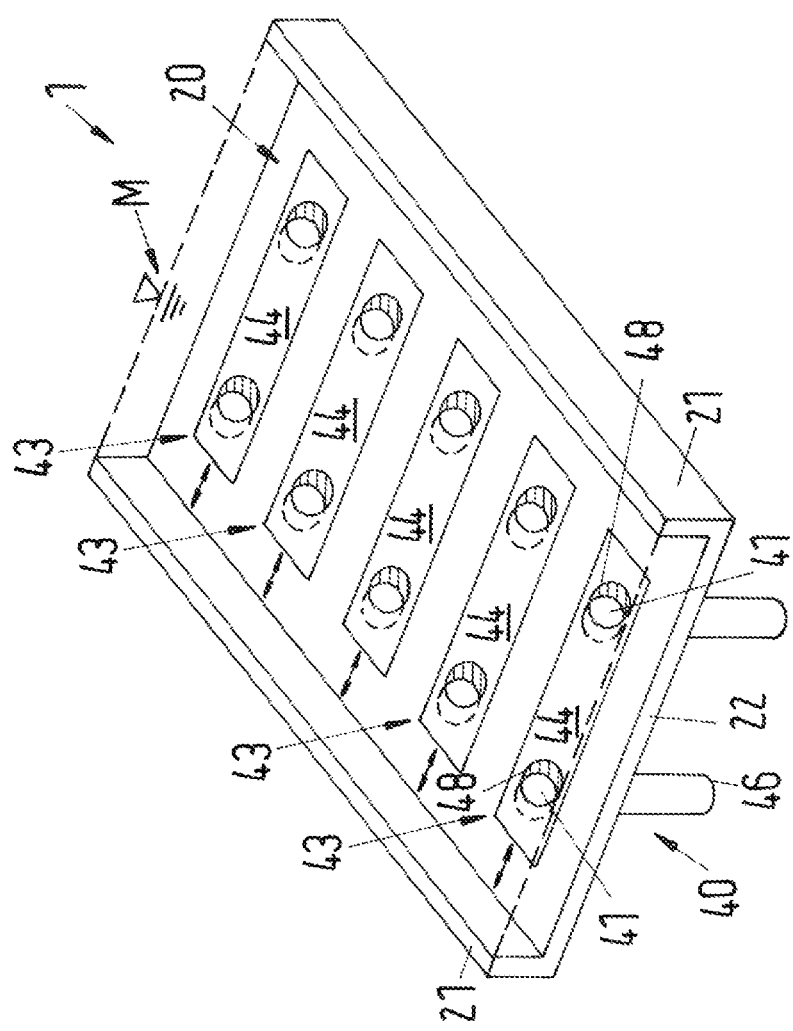

FIGS. 4A, 5A, 5B, 5C show representations of a further device 1 according to the invention of a second design variant of the present invention. In the representation of FIG. 4A, merely side walls 21 parallel to the transport direction T and the bottom wall 22, which delimit the treatment chamber 20 are shown. Side walls arranged at the front and the back and slots contained therein for conducting through the material to be treated have been omitted here for the sake of clarity of the representation. FIGS. 5A, 5B show furthermore material B to be treated which is conveyed through the device, pen stocks 7 arranged above and below the material to be treated, as well as transport devices in the form of wheels 31, 31' acting on the surfaces of the material to be treated and which are borne by driven shafts (the latter not shown). The treatment liquid F fills the treatment chamber up to a bath level M, which is above the transport plane E for the material to be treated and above the pen stocks. For this purpose, the pen stocks continually feed treatment liquid to the treatment chamber. In this respect, please refer to the description of the first design variant.

Figure 5C:
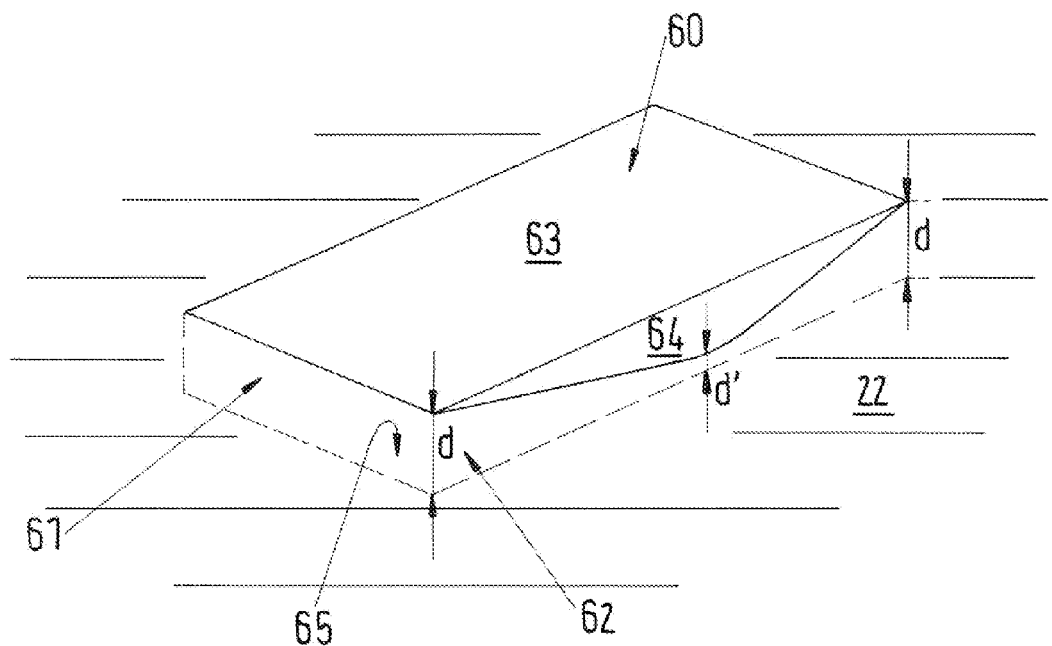

Spaced apart from the bottom wall 22 and above this are shown several screen devices 60 shaped as drain plates 63, which are arranged essentially parallel to the bottom wall 22 delimiting the treatment chamber 20 downwards and under which discharge chambers/outflow chambers 61 are formed (FIGS. 5B, 5C). The drain plates 63 locally form bottom areas of the treatment chamber. The outflow chambers are delimited upwards by the drain plates and downwards by lower wall regions 65, respectively. The drain plates have on one longitudinal side, respectively, folding edges 64, which are wide centrally and are tapered towards the narrow edges. Circumferential passage openings 62 are formed, respectively, between the drain plates 63 with the folding edges and the lower wall region 65 of the outflow chamber 61 and the bottom wall 22 of the treatment chamber. The passage openings 62 extend along the periphery of the folding edges and of the drain plate. The width d' of the passage opening in the central area of the folding edges is narrower than the width d in their end regions.

Below the bottom wall 22 of the treatment chamber 20 are located discharge devices 40 having respective regulating elements 44 (FIG. 5A). The discharge devices are formed by discharge lines/outflow lines 46 with discharge ducts/outflow ducts 47 running therein. The outflow lines lead into the reception area 4 and end below the liquid level N in the reception area. The regulating elements 44 are arranged within the outflow ducts, preferably at their lower ends, and are provided in the form of flaps (FIG. 5A). The possible movement of the flaps is represented by double arrows on the flaps. The regulating elements are actuated via adjusting axes 80 fitted with cardan joints, the adjusting axes being conducted out from the device housing 70 (FIG. 4A). Outside the housing are arranged drives 45, with which the adjusting axes can be shifted in rotation and with which the regulating elements can be set. Due to the arrangement of the drives outside the housing, a special sealing against moisture is not necessary. Through the rotation of the adjusting axes and thus the flaps, the effective cross-section of the outflow ducts is changed in order to regulate the discharge rate of the treatment liquid F from the treatment chamber.

The material B to be treated is transported by means of opposing transport devices 31 through the device 1 perpendicular to the image plane (FIG. 5A) resp. parallel to the image plane (FIG. 5B), wherein the material to be treated is conducted in the transport plane E. The pen stocks 7 supply the material to be treated with treatment liquid F. The treatment liquid is conveyed on the top side and the underside of the material to be treated and comes from there into lateral regions of the treatment chamber 20, which extend parallel to the transport direction T near the conveying path in which the material to be treated is transported. The material to be treated is thereby merely subjected to liquid flows parallel to its surface. A deflection of the material to be treated by these flows is therefore prevented to a great extent. From these lateral areas, the liquid is led to the respective passage openings 62 below the transport plane and comes through them into the outflow chambers 61 under the drain plates 63. The passage openings represent for the treatment liquid a flow resistance, which prevents an increased outflow velocity. Liquid getting into the outflow chambers is led via the respective outflow opening 41 into the outflow duct 47 of the outflow line 46.

In the embodiment shown in FIGS. 4A, 5A, 5B, 5C, to each outflow chamber 61 is assigned only one single outflow opening 41, which departs centrally from the outflow chamber. In order to avoid that the treatment liquid F flowing out on the leading edge of the pieces of material B passes through the area of the passage opening 62, which is next to the outflow opening, without any significant flow resistance, while a greater flow resistance would be exerted against the liquid passing through on a longer flow path in other areas of the passage opening, the passage opening in this area is narrower than in other areas. This is made possible by the special shape of the guide element/folding edge 64. As a result, the flow resistances of different flow paths through the passage opening are widely evened out, so that none of these flow paths is flown through by preference by the liquid and the whole liquid flows out with approximately the same flow velocity in the entire treatment chamber to the outflow chamber and from there through the outflow opening into the outflow duct 47 of the outflow line 46.

Without the measures according to the invention, the transfer of the material B to be treated from a pair of transport wheels 31 to the next pair 31' would be problematic, since the material to be treated would be deflected at its leading edge by the treatment liquid F flowing out, represented in FIG. 5B by the downwardly deflected material piece b' to be treated (represented dashed). This deflection could, for example, be caused by uncontrolled flow conditions in the treatment chamber 20. In the case of deflection, the material to be treated would not be transferred correctly between the pairs of transport wheels, so that it could, for example, jam and be damaged by the transport wheels or other installations of the device. This problem is solved according to the invention also by the regulating elements 44 in the outflow lines 46 and by the screen devices 60, here the drain plates 63 with their folding edges 64.

FIG. 4B shows a representation of a further embodiment of the device according to the invention corresponding to the second design variant, which is essentially built like the one shown in FIGS. 4A, 5A, 5B, 5C. A difference between both embodiments consists in the fact that instead of only one outflow opening, two outflow openings 41 are provided for in each discharge chamber 61, which discharge in an outflow line 46 each with a outflow duct 47, respectively. The outflow lines extend into the liquid reservoir in the reception area and discharge into the latter below the liquid level (not shown). The treatment chamber 20 is in turn closed downwards by the bottom wall 22 as well as in the area of the outflow chambers by screen devices shaped as drain plates (the latter being omitted). The regulating systems 43 for regulating the discharge rates of the treatment liquid F from the outflow chambers and thus from the treatment chamber respectively have a vane 44, which lies against the outflow openings and regulates the passage of liquid through them into the outflow ducts. The vanes are fitted with openings 48 in a distance, which corresponds to the one between the outflow openings of an outflow chamber. These openings are furthermore approximately as large as the outflow openings. Thus, the free outflow cross-section of both outflow openings at an outflow chamber can be set jointly. This is done by translational movement of the vanes (see double arrows). For this purpose, the vanes can be actuated by means of suitable lever rod assemblies (not shown). The vanes of all outflow chambers can likewise be actuated jointly. For this purpose, a suitable lever rod assembly can be provided for. In the representation shown, the outflow openings are partially opened.

FIG. 6 shows a further embodiment of the device 1 according to the invention in the second design variant. Transport devices and pen stocks are not represented for the sake of clarity.

In contrast to the embodiments shown in FIGS. 4A, 4B, 5A, 5B, 5C, the device has in this case a plurality of treatment chambers 20 arranged the one behind the other, which are subdivided from one another by side walls 21 extending transversely with respect to the transport direction T. The side walls closing treatment chambers at their front faces are not shown for the sake of clarity of the representation. In addition, the treatment chambers are closed downwards by the bottom walls 22 resp. drain plates 63.

Furthermore, each treatment chamber 20 is equipped with three outflow openings with outflow lines 46 connected thereto at each outflow chamber 61. The drain plates do not have in the present case any folding edges, since the outflow openings are distributed uniformly over the whole width of the conveying path, in which the material B to be treated is conveyed, so that a largely uniform liquid flow also builds without folding edges in the treatment chamber, through the passage openings and through the outflow chambers. The passage openings for outflowing liquid are formed by slots between the drain plates 63 and the container walls 21. The liquid F flows out from the outflow chambers via three outflow openings, respectively, and from there through outflow ducts downwards in the outflow lines. However, only one outflow opening with an outflow line on each outflow chamber is typically provided for. The outflow lines discharge below the liquid level N in the storage container 70. Regulating systems 40 are formed by flaps rotatably mounted in the outflow ducts as well as by adjusting axes 80, which can be set by external drives.

The bath level M is set just above the side walls 21 of the treatment chambers 20. For this purpose, treatment liquid F is supplied sufficiently via the pen stocks. The liquid thereby flows over the upper edges of the side walls and out downwards into the reception area 4 in the storage container 70. The latter is shown for the sake of clarity of the representation only with side walls parallel to the transport direction, but not with side Walls transverse to the transport direction. The material B to be treated is conducted through the liquid in a small distance above the upper edges of the side walls of the treatment chambers.

LIST OF REFERENCE SIGNS 1 device
4 reception area/storage container
7 supply device, pen stock
9 nozzle
20 treatment chamber
21 side wall
22 bottom wall
30 transport device
31, 31' transport means (wheels, rollers)
35 anodes
36 contacting clamp
40 discharge device
41 discharge opening
43 regulating system
44 regulating element, vane, flap
45 drive
46 discharge line
47 discharge duct
48 opening in the vane
49 housing for the drive
60 screen device
61 discharge chamber
62 passage opening
63 drain plate
64 guide element, folding edge
65 lower wall of the outflow chamber
70 storage container, device housing
80 lever rod assembly, adjusting axis
B material to be treated
b' deflected material piece to be treated
E transport plane
F treatment liquid
M bath level in the treatment chamber
N liquid level
T transport direction

The invention claimed is:

1. A device (1) for the chemical or electrolytic treatment of flat material to be treated (B) with a treatment liquid (F), having
   at least one treatment chamber (20), in which the treatment liquid (F) can be accumulated up to a bath level (M);
   at least one supply device (7) for the supply of treatment liquid (F) into the at least one treatment chamber (20);

at least one transport device (30) position in a transport configured to transport the flat material in a horizontal plane (E) below the bath level (M) through the at least one treatment chamber (20) while the treatment liquid (F) is accumulated in the at least one treatment chamber up to the bath level (M);

at least one reception area (4) for the treatment liquid (F); and at least one discharge device (40) with, respectively, at least one discharge opening (41) for the treatment liquid (F) for conveying the treatment liquid (F) from the at least one treatment chamber (20) with a respective discharge rate into the at least one reception area (4);

wherein the at least one discharge device (40) respectively has at least one regulating system (43), with which the discharge rate of the treatment liquid (F) through the at least one discharge opening (41) is adjustable, wherein at least one screen device (60), respectively, is arranged between the at least one treatment chamber (20) and the at least one discharge device (40) and a respective discharge chamber (61) is formed between the at least one screen device (60) and the at least one discharge opening (41);

characterized in that the at least one screen device is selected from the group consisting of:

(a) screen devices having respectively, at least one passage opening (62) for the passage of the treatment liquid (F) into the at least one discharge chamber (61), which is arranged at the height level of the transport plane (E) for the material (B) to be treated, and (b) screen devices forming respectively, at least partially a bottom of the treatment chamber (20) and essentially extends parallel to a lower wall of the discharge chamber (61) and is spaced from the latter, so that a passage distance is formed between the lower wall of the discharge chamber (61) and the screen device (60), the screen device (60) forming a passage opening (62).

2. The device (1) for the chemical or electrolytic treatment according to claim 1, wherein the bath level (M) is adjustable by means of the regulating system (43).

3. The device (1) for the chemical or electrolytic treatment according to claim 1, characterized in that the at least one discharge device (40) has at least one discharge duct (47), respectively.

4. The device (1) for the chemical or electrolytic treatment according to claim 3, characterized in that the at least one regulating system (43) is arranged on and in the at least one discharge duct (47).

5. The device (1) for the chemical or electrolytic treatment according to claim 3, characterized in that the at least one regulating system (43) has at least one regulating element (44), selected from a group comprising a pump and an element changing the cross-section of the at least one discharge duct (47).

6. The device (1) for the chemical or electrolytic treatment according to claim 5, characterized in that the at least one element (44) changing the cross-section of the at least one discharge duct (47) is selected from a group comprising a valve, a flap and a vane.

7. The device (1) for the chemical or electrolytic treatment according to claim 3, characterized in that at least two discharge ducts (47) are provided for and in that the discharge rates are adjustable jointly via the at least two discharge ducts (47) by means of at least one regulating system (43).

8. The device (1) for the chemical or electrolytic treatment according to claim 3, characterized in that the at least one discharge duct (47) ends below a liquid level (N) in the at least one reception area (4).

9. The device (1) for the chemical or electrolytic treatment according to claim 3, characterized in that the at least one discharge device (40) has at least one discharge line (46), respectively, which defines the respective discharge duct (47).

10. The device (1) for the chemical or electrolytic treatment according to claim 1, characterized in that the at least one regulating system (43) has a respective drive (45), which is arranged spatially separated from the at least one regulating element (44).

11. The device (1) for the chemical or electrolytic treatment according to claim 1, characterized in that the at least one screen device (60) is formed by a drain plate (63), respectively, and in that the at least one drain plate (63) is formed with at least one guide element (64) facing towards the lower wall of the respective discharge chamber (61), respectively, so that a reduced 15 passage distance is formed between the lower wall of the discharge chamber (61) and the at least one guide element (64), said passage distance forming a passage opening (62).

12. The device (1) for the chemical or electrolytic treatment according to claim 11, characterized in that the passage distance is, at locations of the at least one guide element (64), which are adjacent to a discharge opening (41), smaller than at other locations of the at least one guide element (64), which are further away from the discharge opening (41).

13. A method for the chemical or electrolytic treatment of flat material (B) to be treated in a treatment chamber (20) with a treatment liquid (F), in particular using the device (1) for the chemical or electrolytic treatment according to claim 1, comprising the following method steps:

supplying the treatment liquid (F) via at least one supply device (7) to the treatment chamber (20);

discharging the treatment liquid (F) with a respective discharge rate through, respectively, at least one discharge opening (41) of a discharge device (40) from the treatment chamber (20) into at least one reception area (4);

transporting the material (B) to be treated by means of at least one transport device (30) in a horizontal position in a transport plane (E) through the treatment chamber (20), wherein the material (B) to be treated is transported below a bath level (M) of the treatment liquid (F) in the treatment chamber (20) while the treatment fluid is accumulated in the treatment chamber up to the bath level (M); and adjusting the respective discharge rate of the treatment liquid (F) from the treatment chamber (20) by means of a regulating system (43).

14. A device (1) for the chemical or electrolytic treatment of flat material to be treated (B) with a treatment liquid (F), having at least one treatment chamber (20), in which the treatment liquid (F) can be accumulated up to a bath level (M);

at least one supply device (7) for the supply of treatment liquid (F) into the at least one treatment chamber (20);

at least one transport device (30), with which the flat material (B) to be treated can be transported in a horizontal position in a transport plane (E) below the bath level (M) through the at least one treatment chamber (20);

at least one reception area (4) for the treatment liquid (F); and at least one discharge device (40) with, respectively, at least one discharge opening (41) for the treatment liquid (F) for conveying the treatment liquid (F) from the at least one treatment chamber (20) with a respective discharge rate into the at least one reception area (4);

wherein the at least one discharge device (40) respectively has at least one regulating system (43), with which the discharge rate of the treatment liquid (F) through the at least one discharge opening (41) is adjustable, wherein at least one screen device (60), respectively, is arranged between the at least one treatment chamber (20) and the at least one discharge device (40) and a respective discharge chamber (61) is formed between the at least one screen device (60) and the at least one discharge opening (41);

characterized in that the at least one screen device (60) has, respectively, at least one passage opening (62) for the passage of the treatment liquid (F) into the at least one discharge chamber (61), which is arranged at the height level of the transport plane (E) for the material (B) to be treated.

15. A device (1) for the chemical or electrolytic treatment of flat material to be treated (B) with a treatment liquid (F), having at least one treatment chamber (20), in which the treatment liquid (F) can be accumulated up to a bath level (M);

at least one supply device (7) for the supply of treatment liquid (F) into the at least one treatment chamber (20);

at least one transport device (30 configured to transport the flat material in a horizontal plane below the bath level (M) through the at least one treatment chamber (20) while the treatment liquid (F) is accumulated in the at least one treatment chamber up to the bath level (M);

at least one reception area (4) for the treatment liquid (F); and at least one discharge device (40) with, respectively, at least one discharge opening (41) for the treatment liquid (F) for conveying the treatment liquid (F) from the at least one treatment chamber (20) with a respective discharge rate into the at least one reception area (4);

wherein the at least one discharge device (40) respectively has at least one regulating system (43), with which the discharge rate of the treatment liquid (F) through the at least one discharge opening (41) is adjustable, wherein at least one screen device (60), respectively, is arranged between the at least one treatment chamber (20) and the at least one discharge device (40) and a respective discharge chamber (61) is formed between the at least one screen device (60) and the at least one discharge opening (41);

characterized in that the at least one screen device (60) forms, respectively, at least partially a bottom of the treatment chamber (20) and essentially extends parallel to a lower wall of the discharge chamber (61) and is spaced from the latter, so that a passage distance is formed between the lower wall of the discharge chamber (61) and the screen device (60), the screen device (60) forming a passage opening (62).

\* \* \* \* \*